(12) United States Patent
Loubet et al.

(10) Patent No.: US 9,099,570 B2
(45) Date of Patent: Aug. 4, 2015

(54) METHOD FOR THE FORMATION OF DIELECTRIC ISOLATED FIN STRUCTURES FOR USE, FOR EXAMPLE, IN FINFET DEVICES

(71) Applicant: STMicroelectronics, Inc., Coppell, TX (US)

(72) Inventors: Nicolas Loubet, Guilderland, NY (US); Prasanna Khare, Schenectady, NY (US)

(73) Assignee: STMicroelectronics, Inc., Coppell, TX (US)

( * ) Notice: Subject to any disclaimer, the term of this patent is extended or adjusted under 35 U.S.C. 154(b) by 55 days.

(21) Appl. No.: 14/097,556

(22) Filed: Dec. 5, 2013

(65) Prior Publication Data

US 2015/0162248 A1    Jun. 11, 2015

(51) Int. Cl.
*H01L 27/092* (2006.01)
*H01L 21/84* (2006.01)
*H01L 29/66* (2006.01)
*H01L 21/762* (2006.01)
*H01L 21/8234* (2006.01)

(52) U.S. Cl.
CPC ........ *H01L 21/845* (2013.01); *H01L 21/76205* (2013.01); *H01L 21/76283* (2013.01); *H01L 21/823431* (2013.01); *H01L 27/0924* (2013.01); *H01L 29/66818* (2013.01)

(58) Field of Classification Search
CPC .................................................. H01L 21/8232
See application file for complete search history.

(56) References Cited

U.S. PATENT DOCUMENTS

| 6,645,797 B1 | 11/2003 | Buynoski et al. |
| 2008/0224183 A1 | 9/2008 | Nawaz |
| 2010/0163971 A1 | 7/2010 | Hung et al. |
| 2014/0284667 A1 | 9/2014 | Basker et al. |

OTHER PUBLICATIONS

Hisamoto, Digh, et al: "FinFET—A Self-Aligned Double-Gate MOSFET Scalable to 20 nm," IEEE Transactions on Electron Devices, vol. 47, No. 12, Dec. 2000, pp. 2320-2325.

*Primary Examiner* — Cheung Lee
(74) *Attorney, Agent, or Firm* — Gardere Wynne Sewell LLP

(57) ABSTRACT

On a substrate formed of a first semiconductor material, a first overlying layer formed of a second semiconductor material is deposited. A second overlying layer formed of a third semiconductor material is deposited over the first overlying layer. The first and second overlying layers are patterned to define fins, wherein each fin includes a first region formed of the third material over a second region formed of the second material. An oxide material fills the space between the fins. A thermal oxidation is then performed to convert the second region to a material insulating the first region formed of the third material from the substrate. As an optional step, the second region formed of the second material is horizontally thinned before the oxide material is deposited and the thermal oxidation is performed. Once the fins are formed and insulated from the substrate, conventional FinFET fabrication is performed.

20 Claims, 7 Drawing Sheets

METHOD FOR THE FORMATION OF DIELECTRIC ISOLATED FIN STRUCTURES FOR USE, FOR EXAMPLE, IN FINFET DEVICES

TECHNICAL FIELD

The present invention relates to integrated circuits and, in particular, to a process for the formation of fin structures for use in, for example, FinFET-type integrated circuit devices.

BACKGROUND

The prior art teaches the formation of integrated circuits which utilize one or more FinFET type field effect transistors. The FinFET transistor comprises a channel region which is oriented to conduct an electrical current parallel to the surface of the substrate. The channel region is provided in an elongated section of semiconductor material. The source and drain regions of the transistor are formed in the elongated section on either side of the channel region. A gate is placed over and on both opposed sides of the elongated section at the location of the channel region to provide for control over the conductive state of the transistor. This FinFET design is well suited for manufacturing a multi-channel transistor in which multiple elongated sections are formed in parallel to define neighboring channel regions which are separated from each other by an intermediate gate portion of the transistor gate spanning with a perpendicular orientation over the multiple elongated sections.

A FinFET transistor is created from at least one thin portion (referred to as the "fin") of semiconductor material defining the elongated section which is used to form the channel of the transistor and also its source and drain zones. This fin is typically defined by a mask that is formed on top of a monocrystalline silicon (or other semiconductor material, such as silicon-germanium) at the position of the fin. The substrate material is then directionally etched where there is no mask, to a determined depth, such that the elongated section defining the fin remains under the mask and is composed of the substrate material.

In one prior art implementation, the fin of semiconductor material which is thus obtained, and which comprises the channel of the final transistor, is not electrically insulated from the active portion of the circuit substrate, which itself is also of crystalline semiconductor material. Such a FinFET device suffers from three distinct types of leakage current. A first type of leakage current can circulate between the source and drain of the FinFET transistor via the active portion of the substrate situated below the channel. This first leakage current, internal to each transistor, is not controlled by the potential applied to the transistor gate. A second type of leakage current arises because the channel of the FinFET transistor is also in electrical contact with the channels of other transistors of the same conductivity type via the substrate. The second leakage current flows between transistors in the form of an inter-transistor leakage current. A third type of leakage current appears between the channel of each FinFET transistor and a lower part of the substrate in response to the substrate being connected to a reference potential.

To address the leakage current issues noted above, procedures for dielectrically isolating the fin are known in the art.

In one technique, referred to as bottom oxidation through STIs (BOTS), shallow trench isolation (STI) structures are formed on either side of the fin. The silicon material of the fin is protected on a top side by a barrier layer (for example, of silicon nitride) and the upper lateral sides of the fin are isolated from the STI structures by another barrier layer (for example, of silicon nitride). The integrated circuit wafer is then subjected to an oxidation process. The barrier layers function as oxygen ($O_2$) barriers and a lower portion of the fin (below the lateral barrier layers) is converted to a thermal oxide material which isolates the upper portion of the fin from the underlying substrate material. This process produces an undesirable scalloped interface shape at the bottom of the fin (due to the nature of the thermal oxide growth). Additionally, the process is not compatible with fins made of silicon-germanium (SiGe), and thus cannot be advantageously used when forming p-channel SiGe FinFET devices.

In another technique, referred to in the art as silicon on nothing (SON), a bottom portion of the fin is formed of silicon-germanium and an upper portion of the fin is formed of silicon. A selective etch is performed to remove the bottom SiGe portion to open a region between the underside of the Si fin and the underlying substrate. A dielectric material filling operation is then performed to fill the opened region with an insulating material. This process presents mechanical stability issues with respect to the Si fin. Additionally, complete fill of the opened region with the insulating material cannot be assured, and any voids that are left present tunnel fill conformality issues.

There is accordingly a need in the art for an improved process to isolate fins from the substrate during FinFET configuration.

As CMOS process technology continues to scale towards smaller and smaller dimensions, further improvement in transistor performance is needed. Those skilled in the art recognize that the use of silicon-germanium (SiGe) materials for transistor fabrication provide for a significant boost in transistor performance, especially with respect to p-channel field effect transistor devices. Indeed, the art is moving towards the use of SiGe for p-channel devices of many different types. Specific to the use of FinFET devices, those skilled in art recognize a need to form the fin of the p-channel device from a SiGe material in order to reach improved transistor performance levels over prior art Si material only devices. Additionally, the SiGe fin must be isolated from the underlying substrate to address, at the very least, concerns over leakage current as described above.

Thus, the need an improved process to isolate fins from the substrate during FinFET configuration includes the need to provide a solution compatible with the formation SiGe structures.

SUMMARY

In an embodiment, a method comprises: on a substrate formed of a first material, depositing a first overlying layer formed of a second material; depositing over the first overlying layer a second overlying layer formed of a third material; patterning the first and second overlying layers to define a plurality fins, each fin including a first region formed of the third material over a second region formed of the second material; depositing an oxide material to fill space between the plurality of fins; and performing a thermal oxidation to convert the second region to a material insulating the first region formed of the third material from the substrate formed of the first material.

In an embodiment, a method comprises: on a substrate formed of a first material and having a first region and a second region, depositing an overlying first layer formed of a second material; forming for the first region a first material portion over the first layer; forming for the second region a second material portion over the first layer; patterning the first material portion and first layer of the second material to define at least one first fin, each first fin including a first part formed of the first material portion over a second part formed of the second material; patterning the second material portion and first layer of the second material to define at least one second fin, each second fin including a first part formed of the second material over a second part formed of the second material; depositing an oxide material to fill space between the first and second fins; and performing a thermal oxidation to convert the second parts of the first and second fins to a material insulating the first parts of the first and second fins from the substrate formed of the first material.

BRIEF DESCRIPTION OF THE DRAWINGS

For a better understanding of the embodiments, reference will now be made by way of example only to the accompanying figures in which.

DETAILED DESCRIPTION OF THE DRAWINGS

Reference is now made to FIGS. 1-16 which illustrate the process steps in the formation of fins for a FinFET device on a bulk substrate. It will be noted that the illustrations are not necessarily presented to scale.

Figure 1:
FIGS. 1-16 illustrate process steps in the formation of fins (for example, for use in a FinFET device) on a bulk substrate.

FIG. 1 shows a conventional bulk silicon substrate wafer 10 starting with a silicon substrate 14.

Figure 2:
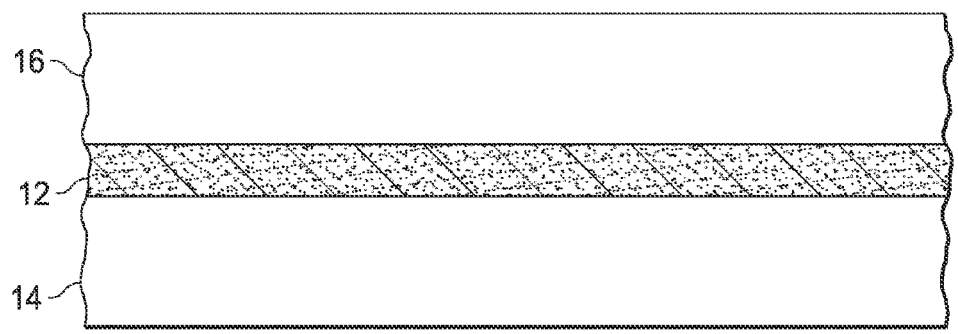

Using an epitaxial process tool, an epitaxial growth process as known in the art is performed to grow a silicon-germanium (SiGe) layer 12 on a silicon substrate 14 of the bulk silicon substrate wafer 10. The thickness of the silicon-germanium (SiGe) layer 12 is, for example, about 10 nm to 60 nm. The Ge content of the SiGe layer can be selected in accordance with the application, for example, with an eye towards the formation of either an n-channel or a p-channel device as will be discussed. In an embodiment, the Ge content may range from about 10% to about 40%. Without removing the substrate wafer 10 from the epitaxial process tool, an epitaxial growth process as known in the art is then performed to grow a silicon (Si) layer 16 on the silicon-germanium (SiGe) layer 12. The thickness of the silicon (Si) layer 16 is, for example, about 10 nm to 60 nm. The stippling in FIG. 2 is provided to differentiate SiGe material from Si material. The silicon-germanium (SiGe) layer 12 and silicon layer 16 may be doped as needed for the integrated circuit application or the fabrication process. For example, n-type or p-type dopants may be added to the silicon layer 16 in order to support n-channel and p-channel transistor configuration.

Although this description is specific to the use of silicon for the layer 16, this is description is exemplary in nature, and it will be understood that the layer 16 may comprise other semiconductor materials including, for example, silicon-germanium as will be discussed herein. In such an implementation, there is an advantage if the germanium percent content present in layer 16 differs from that present in layer 12.

Figure 3:
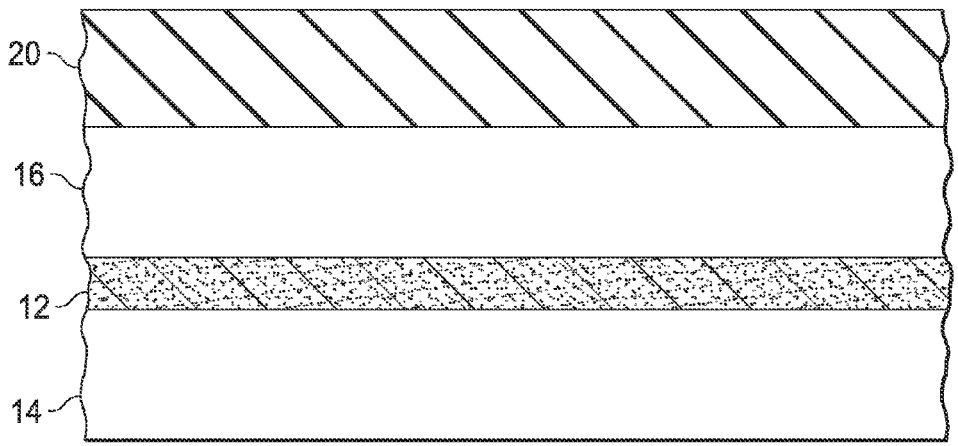

FIG. 3 shows the deposit of a silicon nitride (SiN) layer 20 over the silicon (Si) layer 16. This layer 20 may have a thickness of about 10 nm to 100 nm.

Figure 4:
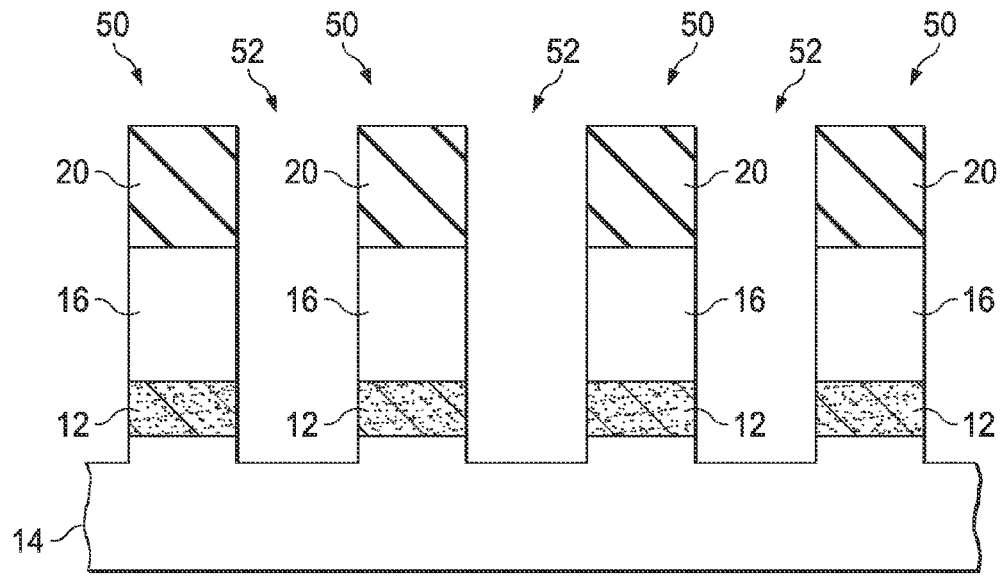

Reference is now made to FIG. 4. A lithographic process as known in the art is then used to define the fins 50 for the FinFET devices. The silicon nitride (SiN) layer 20 applied over the top surface of the silicon (Si) layer 18 is lithographically patterned to leave SiN mask material at the desired locations of the fins 50. An etching operation is then performed to open apertures 52 in the silicon (Si) layer 16 and the silicon-germanium (SiGe) layer 12 on either side of each fin 50. The apertures 152 further extend to reach partially into the substrate 14 so as to ensure the fin depth passes completely through the silicon-germanium (SiGe) layer 12. Each fin 50 is accordingly formed to include a region made of the silicon (Si) layer 16 over a region made of the silicon-germanium (SiGe) layer 12. In a preferred implementation, the etching process may utilize a sidewall image transfer (SIT) process such as that described, for example, in U.S. Pat. No. 8,298,954, the disclosure of which is incorporated by reference.

Figure 5:
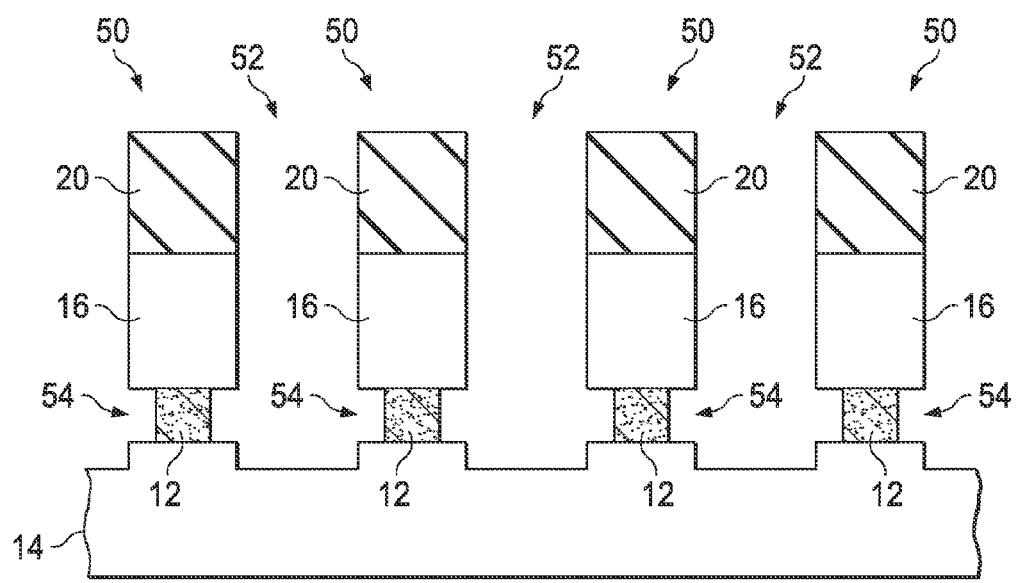

An optional selective etch is then performed as shown in FIG. 5 to form a notch 54 in the sidewall on each side of the fin 50 at the location of the silicon-germanium (SiGe) material of layer 12. The etching technique used is selective for the removal of silicon-germanium in layer 12 relative to silicon in layer 16. For example, the etching technique may comprise an HCl or WETS etch as well known to those skilled in the art. It is important that the etching process be controlled so that only a portion of the silicon-germanium is removed and the regions 16 remain supported.

Figure 6:
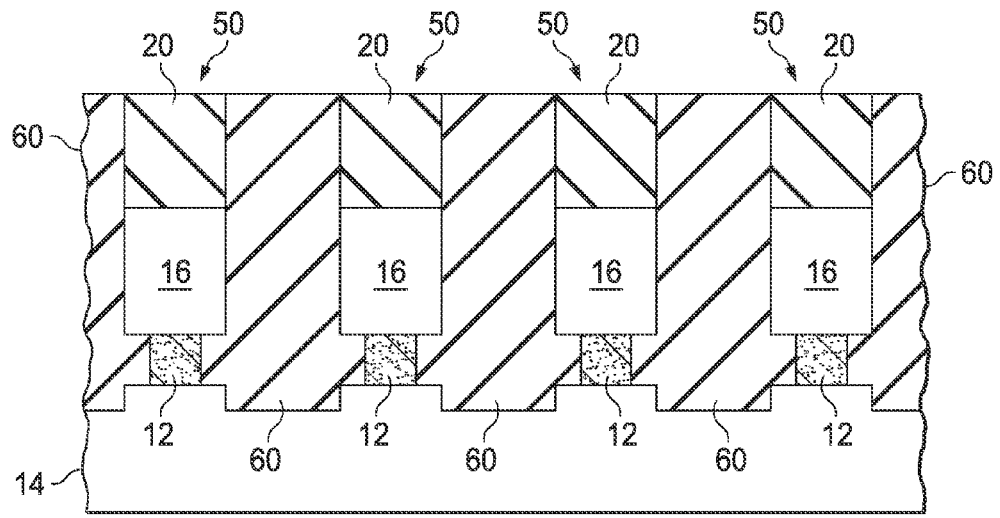

A deposition process is then performed to deposit a dielectric fill material 60. The material 60 fills the spaces between the fins 50 and including the notches 54 (if present). The deposition process may comprise, for example, a chemical vapor deposition process, and the dielectric fill material may comprise, for example, silicon dioxide ($SiO_2$). The material 60 that is deposited will also cover the top of each fin 50 over the mask formed by the silicon nitride (SiN) layer 20. A planarization process (for example, chemical-mechanical polishing (CMP)), is used to flatten the top of the wafer. The polishing process is configured to stop at the mask formed by the silicon nitride (SiN) layer 20. The result of the silicon dioxide ($SiO_2$) deposit and polish process is shown in FIG. 6.

Figure 7:
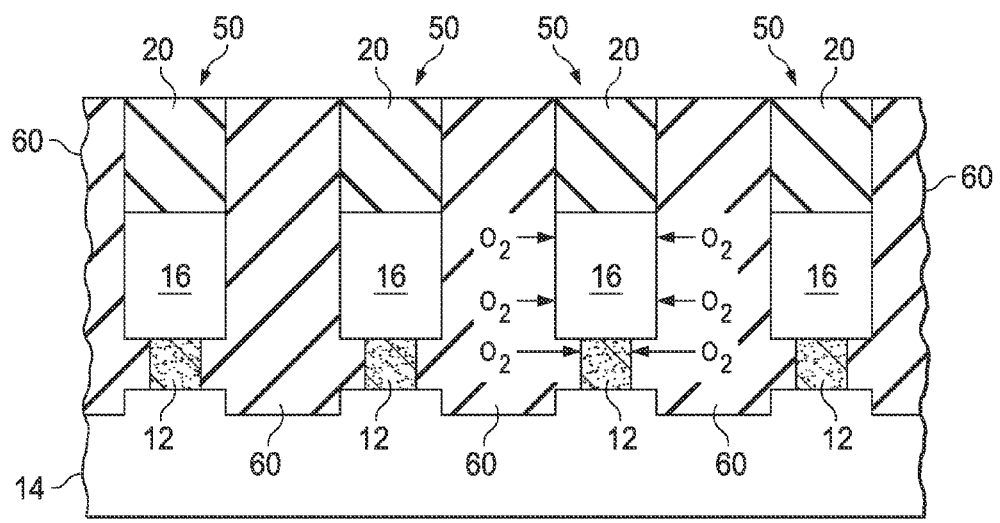
Figure 8:
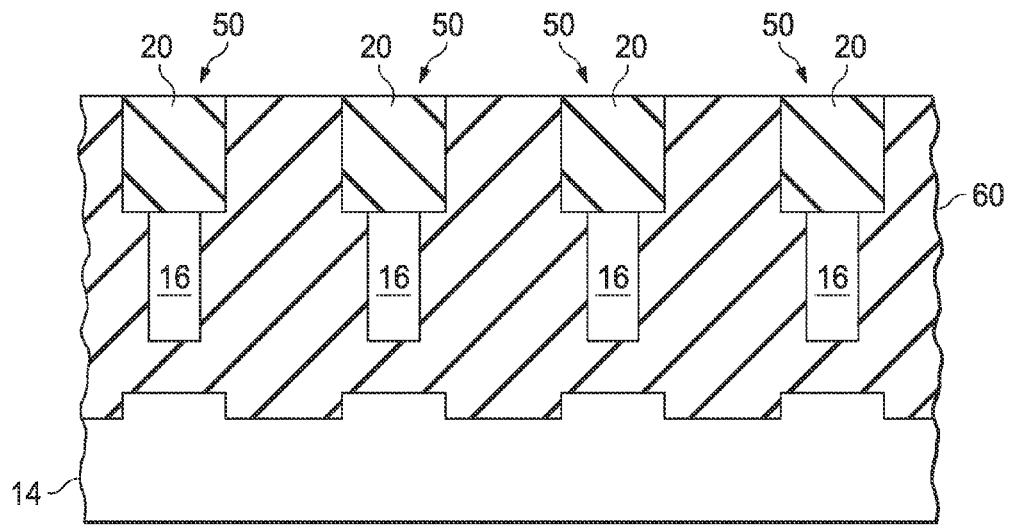

The wafer is then subjected in FIG. 7 to a thermal oxidation process as known in the art with the following process conditions and parameters: using rapid thermal oxidation (RTO) process known in the art in the temperature range of 700° C.-1100° C. for 10-500 seconds under an oxygen ambient. The mask formed by the silicon nitride (SiN) layer 20 functions as a barrier against oxygen ($O_2$) attack at the top of each fin 50. However, the thermal oxidation process will consume the remaining silicon-germanium (SiGe) material portions of layer 12 and a small portion of the silicon material of layer 16 on the lateral sides of each fin 50 for conversion to silicon dioxide ($SiO_2$). The result of the thermal oxidation process is shown in FIG. 8. The dielectric fill material (in this example, silicon dioxide ($SiO_2$)) that was provided laterally between fins 50 so as to insulate the fins from each other is further now present under the silicon material of layer 16 for each fin 50 so as to insulate each fin 50 from the underlying substrate 14 of the wafer.

Figure 9:
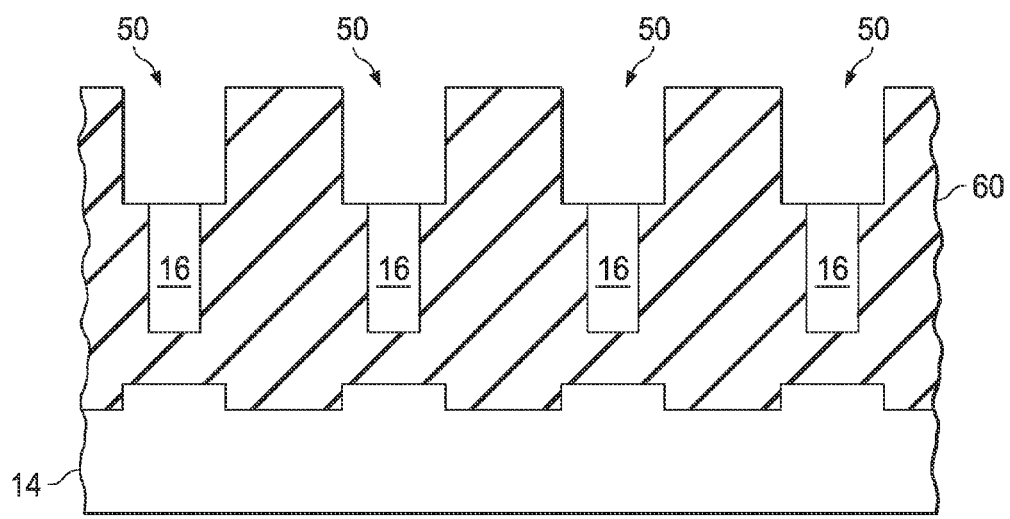

A selective etch is then performed as shown in FIG. 9 to remove the mask formed by the silicon nitride (SiN) layer 20 and expose a top of the silicon material of layer 16 for each fin 50. The selective etch is designed to selectively remove silicon nitride material. In an embodiment, the etch may comprise $H_3PO_4$ applied in a manner well known to those skilled in the art. In an embodiment, the etch may be performed using an RIE process.

Figure 10:
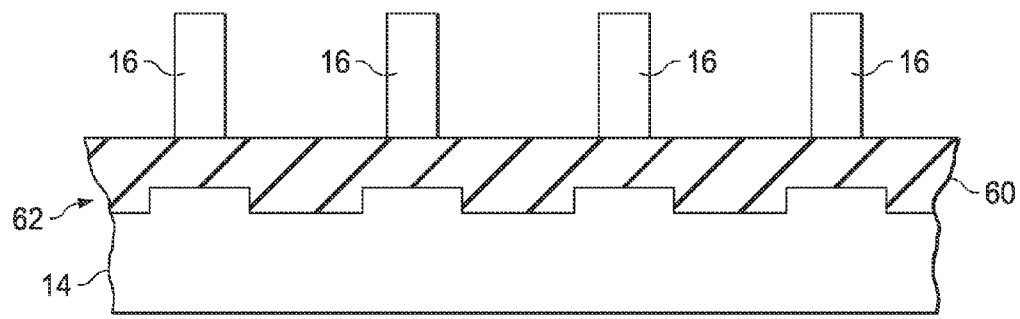

An isolation recess process, for example, performed using wet or dry chemistry as known to those skilled in the art, is then performed to remove a portion of the material ($SiO_2$) of the dielectric fill material 60 (for example to a depth approximately at, equal or slightly below a bottom of the silicon material of layer 16) so as to expose the side surfaces of the region of silicon material from layer 16 for each fin 50. The result of the isolation recess process is shown in FIG. 10. The remaining portion 62 of the dielectric fill material 60 covers the underlying substrate 14 of the wafer and insulates the bottom of the silicon material of layer 16 for each fin 50 from the underlying substrate 14.

Figure 11:
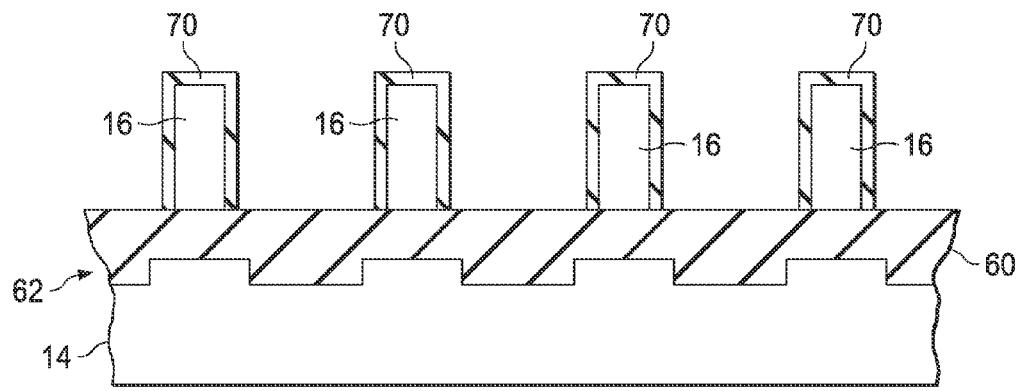
Figure 12:
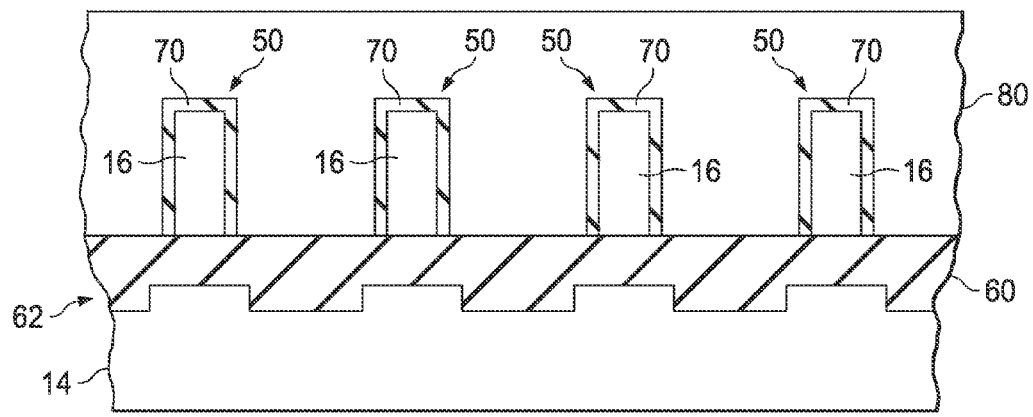

The wafer is then subjected in FIG. 11 to a thermal oxidation process as known in the art. A layer 70 of silicon dioxide (SiO$_2$) is accordingly grown on the sides and top of the silicon material of layer 16 for each fin 50. It will be understood that layer 70 could alternatively be deposited, for example using atomic layer deposition of SiO$_2$ at low temperatures as known to those skilled in the art.

A deposition process is then performed to deposit an amorphous silicon (Si) material 80 to cover the fins 50. The amorphous silicon (Si) material 80 may, if necessary, be polished to provide a flat working surface on the wafer. The wafer is now ready for further processing in a manner well known to those skilled in the art to produce integrated circuit devices such as FinFET transistors of either conductivity type.

For example, the amorphous silicon (Si) material 80 may comprise starting material with respect to the formation of dummy gate structures for the FinFET transistors. The process for gate formation over the formed fins 50/50', as well as the process for definition of source and drain regions and the process for making of electrical contact to source, drain and gate, are well known to those skilled in the art and will not be described herein.

The process described above and illustrated in FIGS. 1-12 is specific to forming fins 50 made of a silicon (Si) material. It will be understood, however, that the process of FIGS. 1-12 is equally compatible with the production of fins made of silicon-germanium (SiGe) material. In such a process, the layer 16 formed in FIG. 2 is instead be formed of silicon-germanium (SiGe) material. In an embodiment, the amount of germanium included in the silicon-germanium material of layer 12 differs from the amount of germanium included in the silicon-germanium material of layer 16. For example, the layer 12 may comprise about 40% Ge and the layer 16 may comprise about >10% Ge. The remaining process steps of FIGS. 4-12 would remain the same, except that the following specific operational modifications are needed to support SiGe fin formation: the etch attack would be selective to Ge-rich materials, such as with the 40% Ge content of the layer 12, to create the notch followed by an oxidation which consumes the SiGe region 12 faster than the SiGe region 16.

Figure 13:
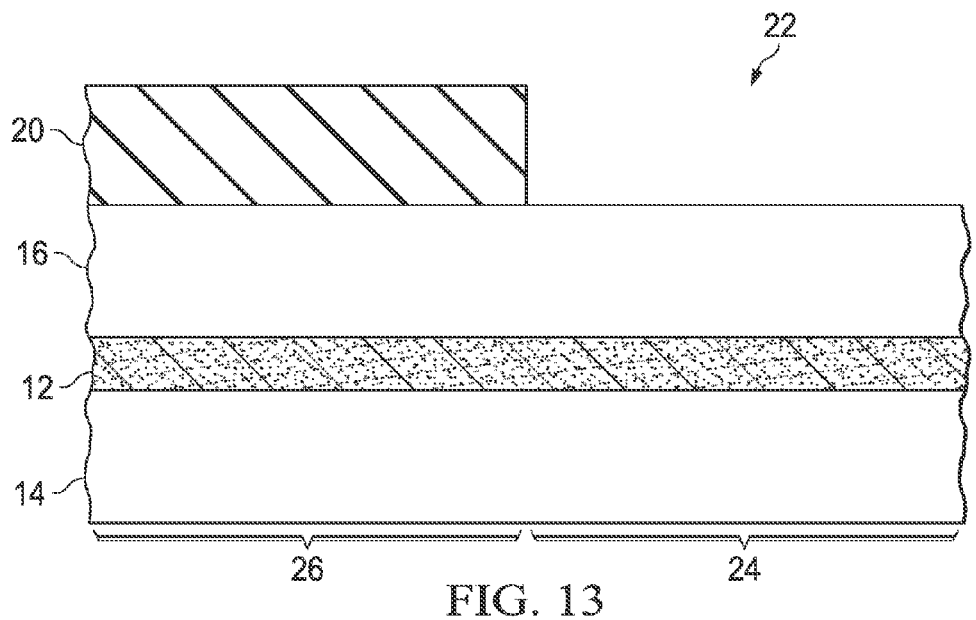

With respect to the formation of complementary transistor structures, for example the formation of p-type and n-type FinFET transistors on a common wafer, those skilled in the art understand the advantages of forming the p-type transistors from doped SiGe fins while the n-type transistors are formed from doped Si fins. Again, the process of FIGS. 1-12 is compatible with the formation of either and indeed both types of FinFET transistor. After having formed the structure shown in FIG. 3 with a silicon (Si) layer 16 and an overlying silicon nitride (SiN) layer 20, a lithographic process as known in the art is then used to form an opening 22 in the silicon nitride (SiN) layer 20 which extends down to reach at least the top surface of the silicon (Si) layer 16. The result of the lithographic process is shown in FIG. 13. The opening 22 is associated with a region 24 of the substrate wafer 10 reserved for the formation of p-channel FinFET devices. The region 26 of the substrate wafer 10 is conversely reserved for the formation of n-channel FinFET devices. In plan view, the opening 22 may take on any desired shape governed by the size and number of p-channel devices to be formed within the region 24.

Using an epitaxial process tool, a high pressure directional etch process (such as an RIE process) as known in the art is then performed to remove a portion 28 of the silicon (Si) layer 16 within the region 24 down to the silicon-germanium (SiGe) layer 12. In an embodiment, the directional etch may comprise a high pressure HCl etch. The result of the directional etch process is shown in FIG. 14.

Figure 14:
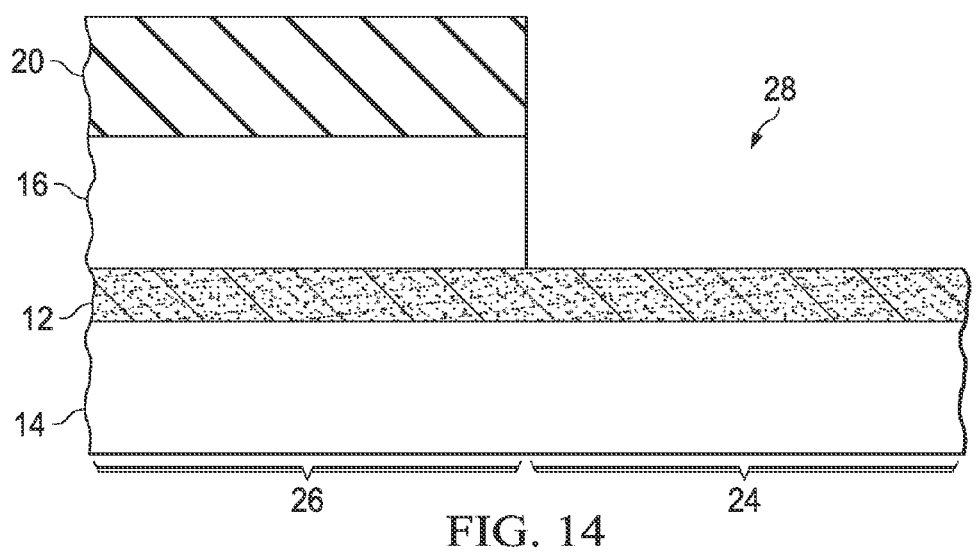
Figure 15:
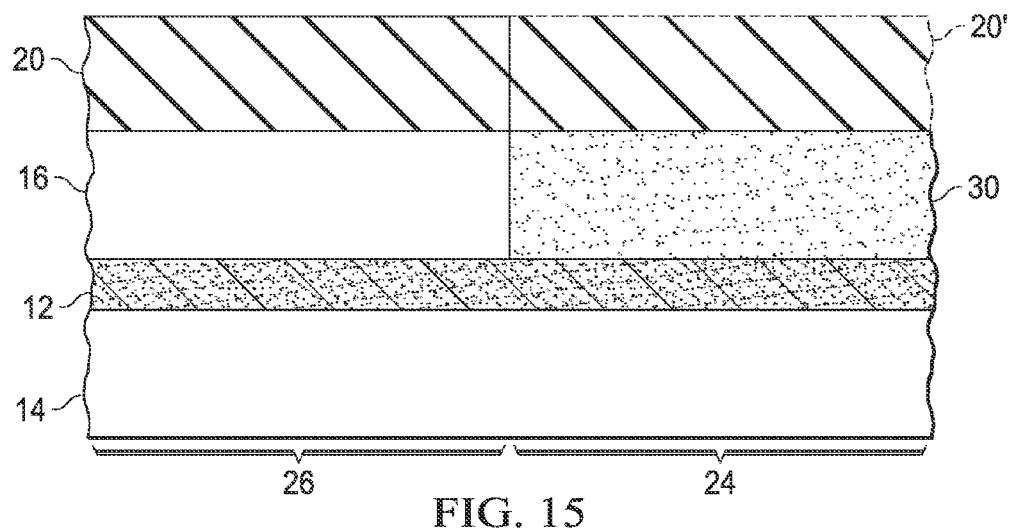

Without removing the substrate 10 from the epitaxial process tool used for the etch of FIG. 14, an epitaxial growth process as known in the art is then performed to grow an additional silicon-germanium (SiGe) layer 30 on top of the silicon-germanium (SiGe) layer 12 in region 24 to fill the portion 28 of the silicon (Si) layer 16 that was previously removed. The result of the epitaxial growth process is shown in FIG. 15. The stippling in FIG. 15 is provided to differentiate SiGe material from Si material. The germanium content percentage for the layer 30 may comprise, for about 10% germanium, while the germanium content percentage for the layer 16 may comprise, for example, about 40% (as suggested by the different degree of stippling in FIG. 15). The thickness of the additional silicon-germanium (SiGe) layer 30 in region 24 is preferably at least the thickness of the silicon (Si) layer 16 in the adjacent region 26. Again, the SiGe material of layer 30 may be doped as appropriate for the application. The silicon nitride (SiN) layer 20 may then be removed and replaced with a new silicon nitride (SiN) layer 20' which covers the wafer and may be subsequently patterned for the fin mask as described above.

Figure 16:
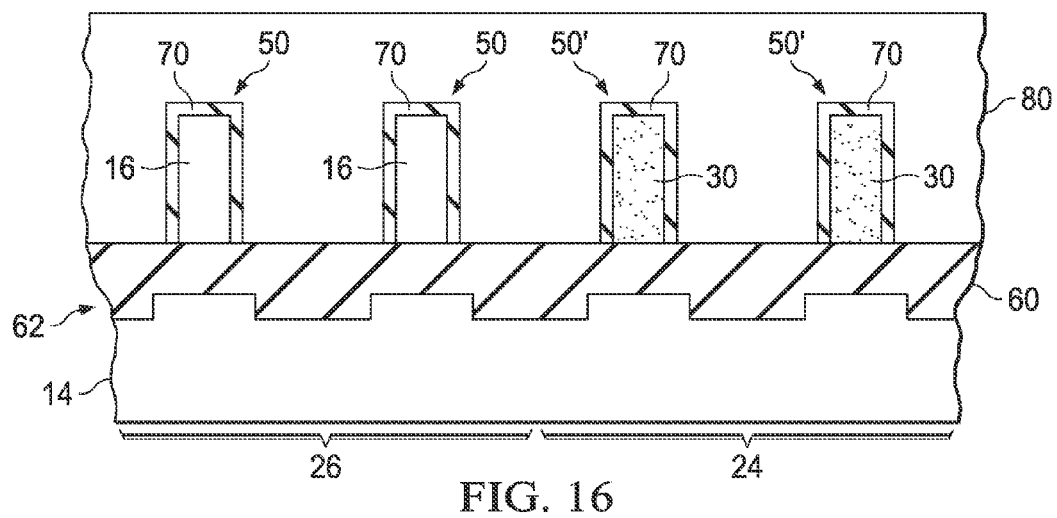

The process then continues with the operations shown in FIG. 4-12. At the end of that process, as shown in FIG. 16, the region 24 of the substrate wafer 10 will include fins 50' of silicon-germanium material (for use, for example, in the formation of p-channel FinFET devices) and the region 26 of the substrate wafer 10 will include fins 50 of silicon material (for use, for example, in the formation of n-channel FinFET devices).

The process for fin 50/50' formation disclosed herein possesses a number of advantages over prior art processes for bulk substrate supported FinFET devices including: a) the process is more simple than with the BOTS or SON processes of the prior art; b) fin height is determined by an epitaxial growth process which results in more uniformly dimensioned fins in comparison to conventional bulk processing which may rely, for example, on a SiO$_2$ recess to define the fin dimensions; c) the fin 50 for the n-channel FinFET devices is formed of silicon (from silicon (Si) layer 16) and the fin 50' for the p-channel FinFET is formed of silicon-germanium (from the silicon-germanium (SiGe) layer 30) which promotes better transistor performance with respect to both conductivity type transistors; d) the source/drain regions of the fins 50/50' are isolated from the bulk silicon substrate 14 by dielectric material (silicon dioxide (SiO$_2$)) so as to suppress junction leakage; e) the process technique is well suited for use in aggressively scaled CMOS fabrication techniques at and below the 10 nm process node; and f) good control over oxidation can be maintained when producing the dielectric isolation from the notched SiGe regions. The steps of the method are common to semiconductor fabrication and can be applied with limited cost.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A method, comprising:
   on a substrate formed of a first material, depositing a first overlying layer formed of a second semiconductor material;
   depositing over the first overlying layer a second overlying layer formed of a third semiconductor material;
   patterning the first and second overlying layers to define a plurality fins, each fin including a first region formed of the third semiconductor material over a second region formed of the second semiconductor material;
   depositing an oxide material to fill space between the plurality of fins; and
   performing a thermal oxidation to convert the second region to a material insulating the first region formed of the third semiconductor material from the substrate formed of the first material.

2. The method of claim 1, wherein the first material is silicon, the second semiconductor material is silicon-germanium and the third semiconductor material is silicon.

3. The method of claim 1, wherein the first material is silicon, the second semiconductor material is silicon-germanium having a first percentage content of germanium and the third material is silicon-germanium having a second percentage content of germanium different from the first percentage content.

4. The method of claim 1, further comprising forming a FinFET transistor from said plurality of fins.

5. The method of claim 1, further comprising removing said oxide material filling the space between the plurality of fins so as to expose side surfaces of said first regions formed of the third semiconductor material.

6. The method of claim 5, further comprising oxidizing the exposed side surfaces of said first regions formed of the third semiconductor material.

7. The method of claim 6, further comprising depositing a fourth material to cover the oxidized first regions formed of the third semiconductor material.

8. The method of claim 7, wherein the fourth material is the same as the first material.

9. The method of claim 8, wherein the first and fourth materials are silicon and the second semiconductor material is silicon-germanium.

10. The method of claim 1, further comprising horizontally thinning the second region formed of the second semiconductor material before the oxide material is deposited and the thermal oxidation is performed.

11. The method of claim 1, wherein patterning the first and second overlying layers comprises:
   depositing a masking layer over the second overlying layer formed of a third semiconductor material; and
   patterning the masking layer to provide a mask for forming the plurality of fins.

12. A method, comprising:
   on a substrate formed of a first semiconductor material and having a first region and a second region, depositing an overlying first layer formed of a second semiconductor material;
   forming for the first region a first semiconductor material portion over the first layer;
   forming for the second region a second semiconductor material portion over the first layer;
   patterning the first semiconductor material portion and first layer of the second semiconductor material to define at least one first fin, each first fin including a first part formed of the first semiconductor material portion over a second part formed of the second semiconductor material;
   patterning the second material portion and first layer of the second semiconductor material to define at least one second fin, each second fin including a first part formed of the second semiconductor material over a second part formed of the second semiconductor material;
   depositing an oxide material to fill space between the first and second fins; and
   performing a thermal oxidation to convert the second parts of the first and second fins to a material insulating the first parts of the first and second fins from the substrate formed of the first material.

13. The method of claim 12, wherein the first semiconductor material is silicon and the second semiconductor material is silicon-germanium.

14. The method of claim 12, further comprising:
   forming a first conductivity type FinFET transistor from said first fin; and
   forming a second conductivity type FinFET transistor from said second fin.

15. The method of claim 14, wherein the first conductivity type is n-type device and second conductivity type is p-type.

16. The method of claim 12, further comprising horizontally thinning the second parts of the first and second fins before the oxide material is deposited and the thermal oxidation is performed.

17. The method of claim 12, further comprising removing said oxide material filling the space between the fins so as to expose side surfaces of the first parts of the first and second fins.

18. The method of claim 17, further comprising oxidizing the exposed side surfaces.

19. The method of claim 18, further comprising depositing a material to cover the oxidized first parts of the first and second fins.

20. The method of claim 12, wherein the substrate is a bulk substrate.

* * * * *